United States Patent
Tokuda

(10) Patent No.: US 7,463,334 B2
(45) Date of Patent: Dec. 9, 2008

(54) EXPOSURE APPARATUS AND DEVICE MANUFACTURING METHOD

(75) Inventor: Yukio Tokuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/866,686

(22) Filed: Oct. 3, 2007

(65) Prior Publication Data

US 2008/0084547 A1    Apr. 10, 2008

(30) Foreign Application Priority Data

Oct. 10, 2006   (JP)   ............... 2006-276949

(51) Int. Cl.
  *G03B 27/42*   (2006.01)
  *G03B 27/58*   (2006.01)
  *G03B 27/62*   (2006.01)
(52) U.S. Cl. .................. 355/53; 355/72; 355/75
(58) Field of Classification Search .......... 355/53, 355/72, 75, 77; 396/399, 400
  See application file for complete search history.

(56) References Cited

U.S. PATENT DOCUMENTS

| 5,187,519 A | | 2/1993 | Takabayashi et al. ......... 355/53 |
| 5,909,272 A | * | 6/1999 | Osanai et al. ................. 355/53 |
| 6,493,062 B2 | | 12/2002 | Tokuda et al. |
| 6,538,720 B2 | * | 3/2003 | Galburt et al. ................ 355/53 |

FOREIGN PATENT DOCUMENTS

JP    11-297587    10/1999

* cited by examiner

*Primary Examiner*—Alan A Mathews
(74) *Attorney, Agent, or Firm*—Fitzpatrick, Cella, Harper & Scinto

(57) ABSTRACT

An exposure apparatus is disclosed. The exposure apparatus has a projection optical system, aligns a reticle and a substrate and projects a pattern of the reticle to the substrate via the projection optical system to expose the substrate to light. The apparatus comprises a measuring device configured to perform measurement for the alignment, a first support configured to support the measuring device; and a second support configured to support the projection optical system. The first support and the second support are isolated from each other.

8 Claims, 6 Drawing Sheets

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

Along with the recent increase in the degree of integration of semiconductor devices, higher resolving powers are demanded of semiconductor exposure apparatuses. To increase the resolving power, a projection optical system needs to have an NA equal to or higher than 0.9 to result in a further increase in the size of the projection optical system.

FIG. 4 is a schematic view showing the arrangement of an exposure apparatus described in Japanese Patent Laid-Open No. 11-297587. To reduce vibration, active mounts 12 including actuators support a barrel support (projection optical system support) 10 supporting a projection optical system 9. A Z interferometer 16 and X-Y interferometer 17 for measuring the position of a wafer stage 7 supporting a wafer 6 are attached to the barrel support 10. The interferometers 16 and 17 measure the position of the wafer stage 7 relative to the projection optical system 9 to align the wafer stage 7 based on this measurement result.

When the interferometers 16 and 17 are attached to the barrel support 10 in the above-described way, measurement errors occur upon deformation of the barrel support 10. The barrel support 10 may deform not only when the actuator of the active mount 12 generates heat but also when a heavy structure is mounted on the barrel support 10. In particular, upon mounting a relatively heavy projection optical system 9, the barrel support 10 may significantly deform.

As a measure against such deformation, the barrel support 10 may be made of a low-thermal-expansive material or may be increased in size. However, the former measure is disadvantageous from the viewpoint of cost, while the latter measure increases the size of the whole apparatus and requires a long time to manufacture the barrel support 10.

SUMMARY OF THE INVENTION

The present invention has been made in consideration of the above background, and has as its exemplary object to decrease measurement errors due to deformation of a support for supporting a projection optical system.

According to the present invention, an exposure apparatus which has a projection optical system, aligns a reticle and a substrate and projects a pattern of the reticle to the substrate via the projection optical system to expose the substrate to light is disclosed. The apparatus comprises a measuring device configured to perform measurement for the alignment, a first support configured to support the measuring device; and a second support configured to support the projection optical system. The first support and the second support are isolated from each other.

According to the present invention, it is possible to, for example, decrease measurement errors due to deformation of a support supporting a projection optical system.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

First Embodiment

Figure 1:
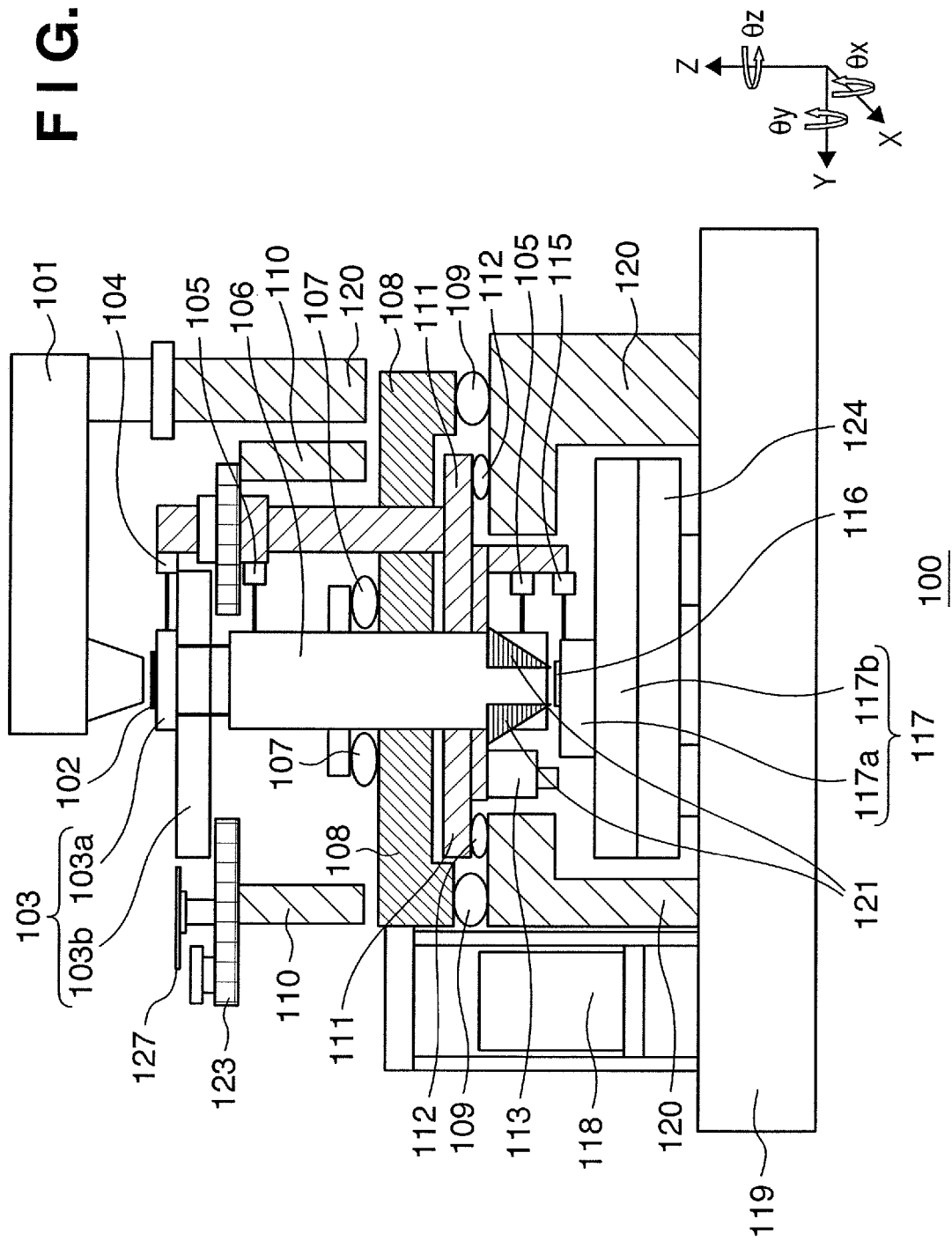
FIG. 1 is a schematic view showing an exposure apparatus according to the first embodiment.

FIG. 1 is a schematic view showing an exposure apparatus according to the first embodiment of the present invention. An exposure apparatus 100 shown in FIG. 1 is configured to align a reticle (also called an original or mask) 102 and a wafer (also called a substrate) 116 and project the pattern of the reticle 102 to the wafer 116 via a projection optical system 106 to expose the wafer 116.

The exposure apparatus 100 comprises an illumination optical system 101 which illuminates the reticle 102 with a light beam, and a reticle stage unit 103 which holds and drives the reticle 102. The exposure apparatus 100 also comprises the projection optical system 106 which projects the pattern drawn on the reticle 102 to the wafer 116, and a wafer stage unit 117 which holds and drives the wafer 116.

A base frame 120 mounted on a pedestal (base) 119 supports the illumination optical system 101. The reticle stage unit 103 includes a movable portion (a portion which holds and moves the reticle 102: a reticle stage) 103a which holds and moves the reticle 102, and a driving unit 103b which drives the movable portion 103a. A laser interferometer 104 measures the position of the movable portion 103a.

The driving unit 103b is controlled based on the output from the laser interferometer 104. The measurement axes of the laser interferometer 104 and the driving axes of the movable portion 103a preferably lie in a total of six axis-directions, that is, the X, Y, and Z directions and the ωx, ωy, and ωz directions which are the rotational directions about the respective axes. A reticle stage surface plate 123 supports the reticle stage unit 103, while a support 110 integrated with the base frame 120 supports the reticle stage surface plate 123.

A measuring system support 111 as an example of the first support supports the laser interferometer 104 as an example of a measuring device for performing measurement to align the reticle and the wafer.

A barrel support 108 as an example of the second support supports the projection optical system (barrel) 106 via mounts 107 as an example of a vibration isolating unit. The mounts 107 are interposed between the projection optical system 106 and the barrel support 108 so as to suppress vibration of the projection optical system 106. The mount 107 comprises an active mount including an actuator and an air mount which blocks the transmission of vibration from the barrel support 108 to the projection optical system 106. An acceleration sensor can measure vibration of the projection optical system 106.

The base frame 120 supports the barrel support 108 via mounts 109 as an example of a vibration isolating unit. The mounts 109 are interposed between the barrel support 103 and the base frame 120 so as to suppress vibration of the projection optical system 106. The mount 109 comprises an active mount including an actuator and an air mount which blocks the transmission of vibration from the base frame 120 to the barrel support 108. The mounts 107 and 109 are not limited to the above-described arrangements as long as they have a vibration suppression or vibration insulation function.

The measuring system support 111 as an example of the first support and the barrel support 108 as an example of the second support are isolated so as to prevent vibration from being transmitted between them. That is, at least one vibration isolating unit, that is, mounts 112 and 109 in this embodiment is inserted in the path between the measuring system support 111 and the barrel support 108.

The wafer stage unit 117 includes a movable portion 117a which holds and moves the wafer 116, and a driving unit 117b which drives the movable portion 117a. A laser interferometer 115 as an example of a measuring device measures the position of the movable portion 117a. The driving unit 117b is controlled based on the output from the laser interferometer 115. The measurement axes of the laser interferometer 115 and the driving axes of the movable portion 117a preferably lie in a total of six axis-directions, that is, the X, Y, and Z directions and the ωx, ωy, and ωz directions which are the rotational directions about the respective axes. A wafer stage surface plate 124 supports the wafer stage unit 117, while the measuring system support 111 supports the laser interferometer 115. The wafer stage surface plate 124 is mounted on the pedestal 119.

A laser interferometer 105 as an example of the second measuring device measures the positional relationship between the projection optical system (barrel) 106 and the measuring system support 111. The positional relationship between the projection optical system (barrel) 106 and the measuring system support 111 can be adjusted based on the measurement result obtained by the laser interferometer 105. This makes it possible to guarantee the positional relationship among the projection optical system 106, the reticle 102, and the wafer 116. The measurement axes of the laser interferometer 105 preferably lie in the above-described six axis-directions.

As described above, the measuring system support 111 isolated from the barrel support 108 supports the laser interferometers 104, 105, and 115. This makes it possible to greatly decrease measurement errors due to the influence of deformation of the barrel support 108. Also as described above, the mounts 109 support the barrel support 108, while the mounts 112 support the measuring system support 111. This makes it possible to suppress vibration from being transmitted between the barrel support 108 and the measuring system support 111.

The measuring system support 111 supports an alignment sensor 113 for aligning the wafer 116, and a focus sensor 121 for measuring the surface level of the wafer 116. The alignment sensor (X-Y measuring device) 113 is an example of a measuring device, which measures the position of an alignment mark on the wafer in a direction perpendicular to the optical axis of the projection optical system 106. The focus sensor (Z measuring device) 121 is an example of a measuring device, which measures the position of the wafer along the optical axis of the projection optical system 106.

The exposure apparatus 100 can comprise a reticle conveyance device 127 for conveying the reticle to the reticle stage unit 103. The exposure apparatus 100 can also comprise a conveyance device 118 for conveying the wafer 116 to a chuck (not shown) of the wafer stage unit 117.

The wafer conveyed by the conveyance device 118 is mounted on the chuck of the wafer stage unit 117 after pre-alignment. The wafer mounted on the chuck of the wafer stage unit 117 is exposed to light after undergoing measurement for alignment by the alignment sensor 113. More specifically, the alignment sensor 113 detects the position of the mark formed on the wafer in the preceding step, to expose the wafer to light while controlling the wafer stage unit 117 based on the detection result. This makes it possible to accurately superimpose patterns on the wafer.

In the exposure process, the movable portion 103a of the reticle stage unit 103 and the movable portion 117a of the wafer stage unit 117 are scan-driven in synchronism with each other.

Second Embodiment

Figure 2:
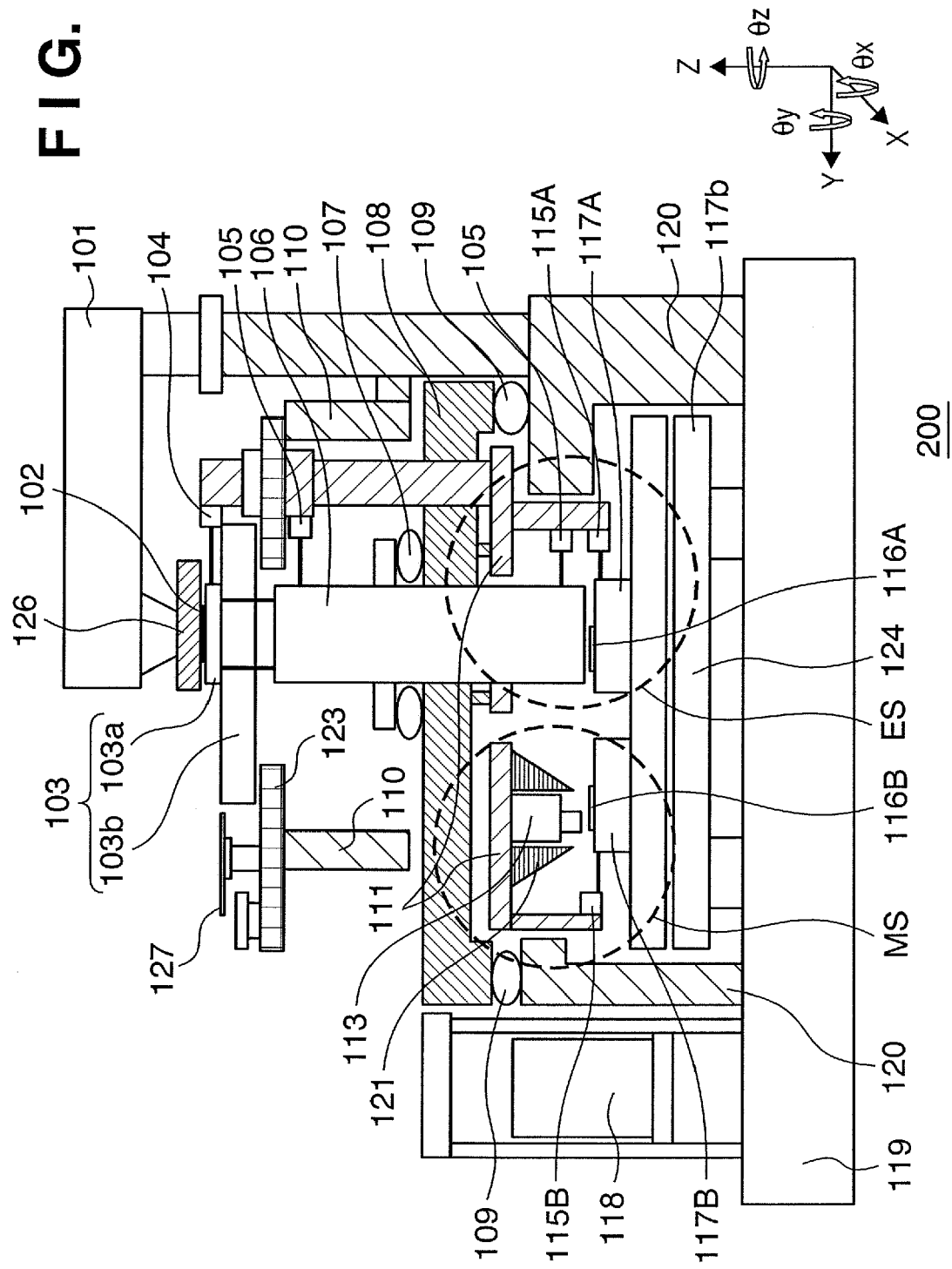
FIG. 2 is a schematic view showing an exposure apparatus according to the second embodiment.

FIG. 2 is a schematic view showing an exposure apparatus according to the second embodiment of the present invention. Details which are not particularly referred to here can be the same as in the first embodiment. The same reference numerals as in the first embodiment denote the same constituent elements in the second embodiment.

An exposure apparatus 200 shown in FIG. 2 comprises two movable portions 117A and 117B as movable portions (i.e., wafer stages) of a wafer stage unit 117. Such a wafer stage unit is called a wafer stage unit with twin stages. The wafer stage unit may have three or more movable portions (i.e., wafer stages).

The exposure apparatus 200 can perform measurement to align a wafer held on one stage in a measurement station MS, while it exposes to light a wafer held on the other stage in an exposure station ES.

A measuring system support (an example of the first support) 111 supports a laser interferometer (an example of a measuring device) 115A for measuring the position of the movable portion (wafer stage) in the exposure station ES. Likewise, the measuring system support 111 supports a laser interferometer (an example of a measuring device) 115B for measuring the position of the movable portion (wafer stage) in the measurement station MS. In the measurement station MS, the measuring system support 111 also supports an alignment sensor (an example of a measuring device) 113 for aligning a wafer 116, and a focus sensor (an example of a measuring device) 121 for measuring the surface level of the wafer 116.

The exposure apparatus 200 can comprise a TTL alignment microscope 126 for observing reference marks on the object and image sides of a projection optical system 106 via the projection optical system 106.

Figure 3:
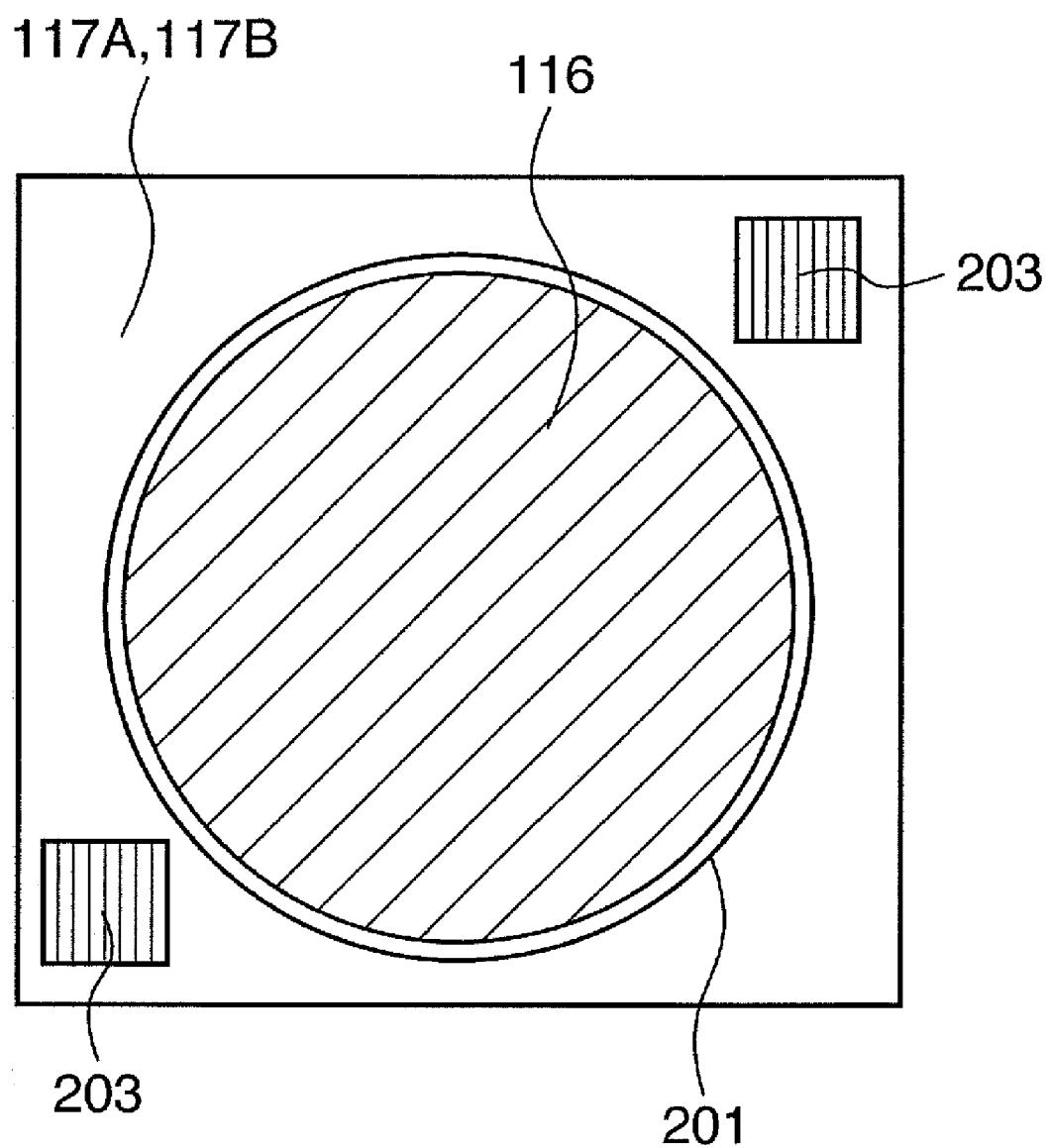
FIG. 3 is a plan view showing an arrangement of movable portions (stages) of a wafer stage unit.
Figure 4:
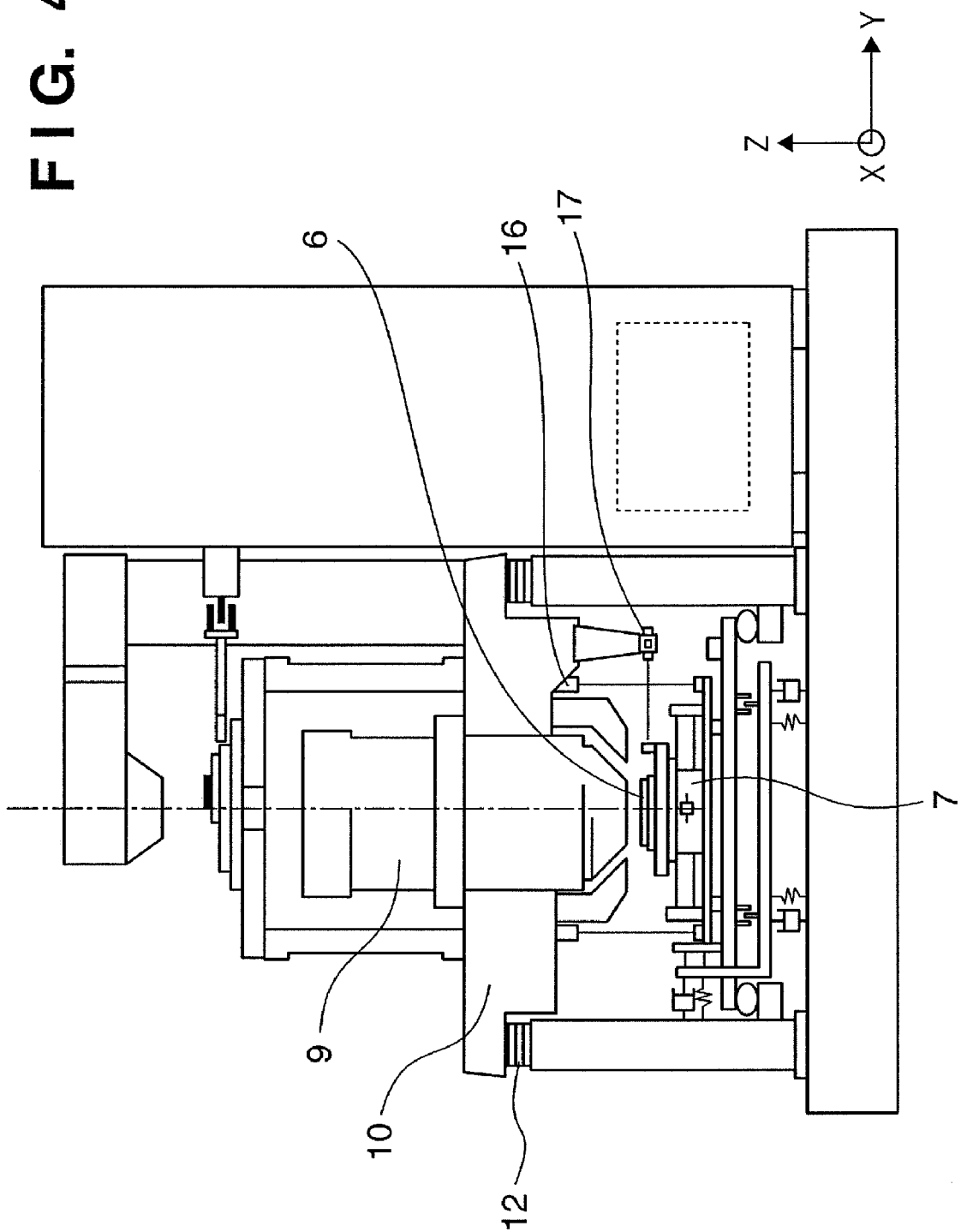
FIG. 4 is a schematic view showing a conventional exposure apparatus.

FIG. 3 is a plan view showing an arrangement of the movable portions (stages) 117A and 117B of the wafer stage unit 117. A chuck 201 mounted on each of the movable portions (stages) 117A and 117B holds the wafer 116. Reference marks 203 are formed on each of the movable portions (stages) 117A and 117B. The TTL alignment microscope 126 is used to observe these reference marks 203 so as to measure the positional relationship between the reticle and the wafer. On the basis of this measurement result, the difference between the measurement result obtained in the measurement station MS and that obtained in the exposure station ES is calculated.

The operation of the exposure apparatus 200 will be briefly explained below.

A reticle conveyance device 127 conveys a reticle to a predetermined position of a movable portion 103a of a reticle stage unit 103.

A wafer conveyance device 118 conveys a wafer to the movable portion (stage) of the wafer stage unit 117 in the measurement station MS. The wafer normally undergoes pre-alignment when being conveyed.

In the measurement station MS, the alignment sensor 113 measures the positions of the reference marks 203 and alignment mark on the wafer. On the basis of this measurement result, the positional relationship between the reference marks 203 and shots on the wafer, and the shot arrangement on the wafer are calculated.

Subsequently, in the measurement station MS, the focus sensor 121 measures the surface shape (focus value) of the wafer while driving it.

The measured wafer is conveyed to the exposure station ES while being held by the chuck 201 on the movable portion (stage). At this time, the movable portion (stage) in the exposure station ES is moved to the measurement station MS. That is, the measurement station MS and the exposure station ES exchange their movable portions (stages).

In the exposure station ES, the TTL alignment microscope 126 measures the positional relationship between the reference marks 203 on the wafer stage unit 117 and a reference mark formed on the reticle or the movable portion 103a of the reticle stage unit 103. On the basis of this measurement result, the position of the movable portion (wafer stage) measured by the laser interferometer 115A in the exposure station ES, and the shot arrangement and focus value (surface shape) obtained in the measurement station MS are corrected.

A plurality of shot regions are sequentially exposed to light on the basis of the corrected shot arrangement and focus value.

Parallel to the above-described exposure process, the next wafer is measured in the measurement station. After completing the exposure and measurement processes, the measurement station MS and the exposure station ES exchange their movable portions (stages). A plurality of wafers are processed by repeating this operation.

APPLICATION EXAMPLE

Figure 5:
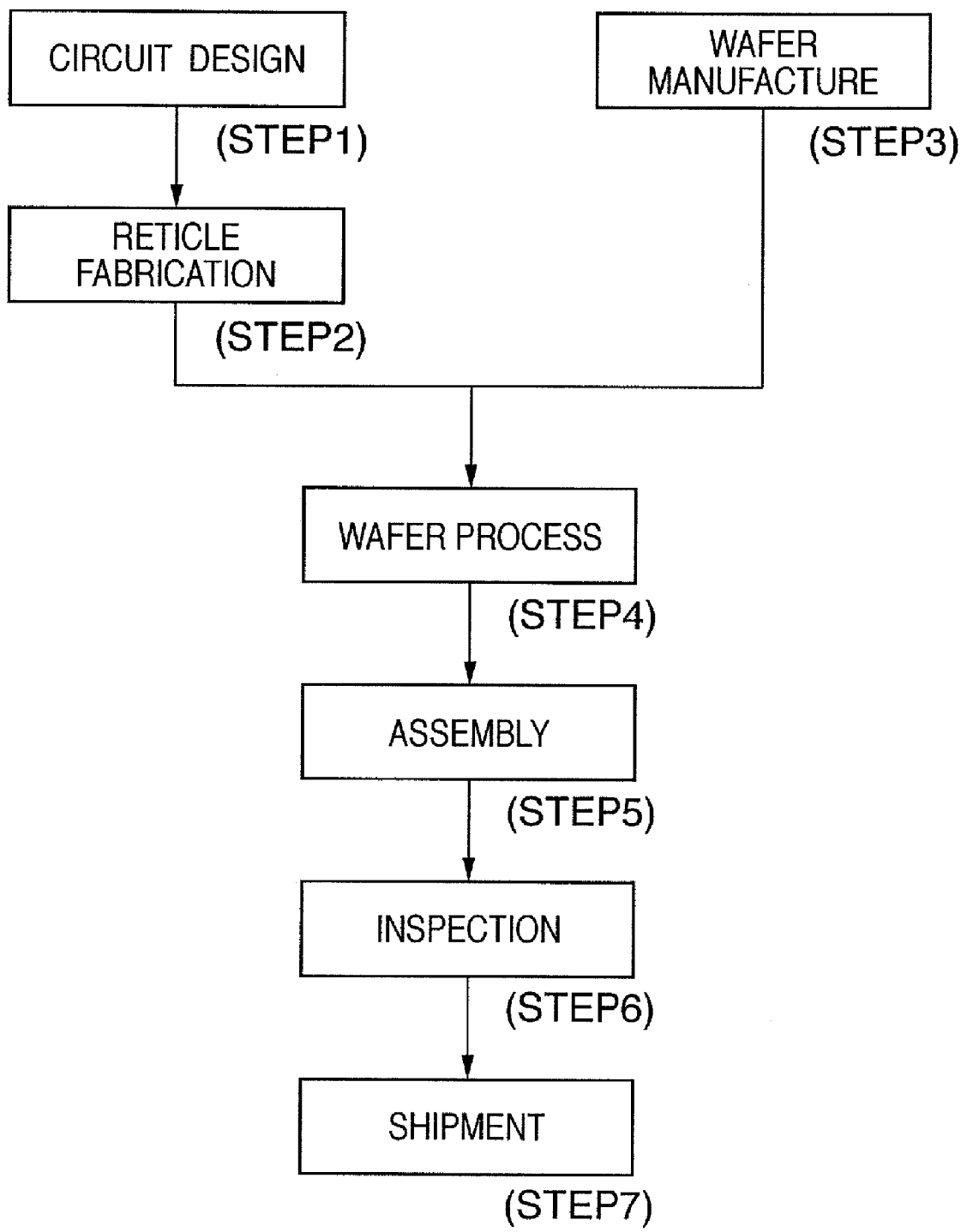
FIG. 5 is a flowchart illustrating the sequence of the overall semiconductor device manufacturing process.

A device manufacturing method using the above-described exposure apparatus will be explained next. FIG. 5 is a flowchart illustrating the sequence of the overall semiconductor device manufacturing process. In step 1 (circuit design), the circuit of a semiconductor device is designed. In step 2 (reticle fabrication), a reticle is fabricated on the basis of the designed circuit pattern. In step 3 (wafer manufacture), a wafer is manufactured using a material such as silicon. In step 4 (wafer process) called a preprocess, an actual circuit is formed on the wafer by lithography using the reticle and wafer. In step 5 (assembly) called a post-process, a semiconductor chip is formed using the wafer manufactured in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped in step 7.

Figure 6:
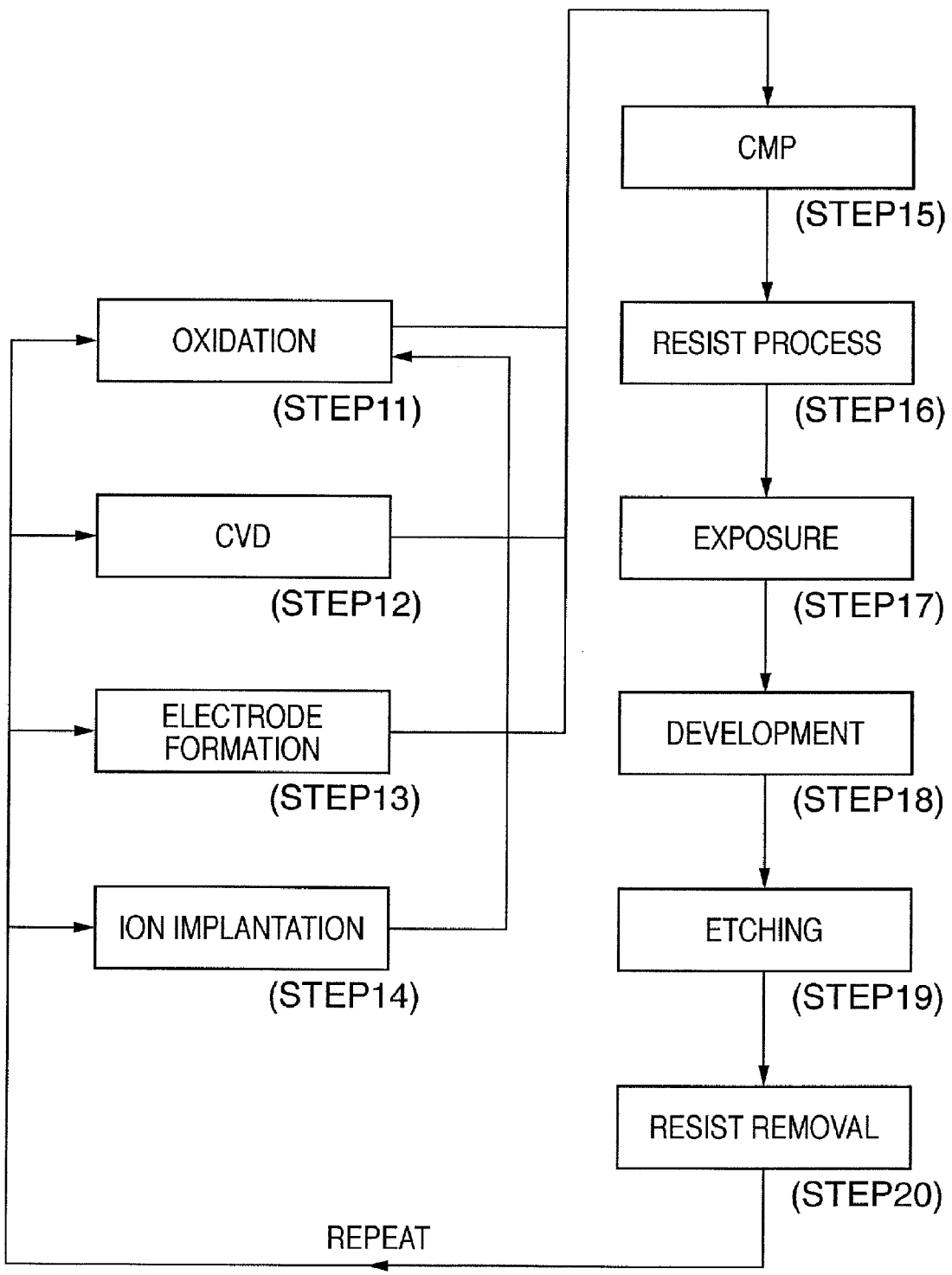
FIG. 6 is a flowchart illustrating the detailed sequence of the wafer process.

FIG. 6 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the insulating film is planarized by CMP. In step 16 (resist process), a photosensitive agent is applied to the wafer. In step 17 (exposure), the above-described exposure apparatus is used to form a latent pattern on the resist by exposing the wafer coated with the photosensitive agent to light via the mask on which the circuit pattern is formed. In step 18 (development), the latent pattern formed on the resist on the wafer is developed to form a resist pattern. In step 19 (etching), the layer or substrate under the resist pattern is etched through a portion where the resist pattern opens. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-276949, filed Oct. 10, 2006, which is hereby incorporated by reference herein in its entirety.

What is claimed is:

1. An exposure apparatus which has a projection optical system, aligns a reticle and a substrate and projects a pattern of the reticle to the substrate via the projection optical system to expose the substrate to light, the apparatus comprising:
   a measuring device configured to perform measurement for the alignment;
   a first support configured to support the measuring device; and
   a second support configured to support the projection optical system,
   wherein the first support and the second support are isolated from each other.

2. An apparatus according to claim 1, further comprising a common frame configured to support the first support and the second support.

3. An apparatus according to claim 2, further comprising:
   a first vibration isolating unit arranged between the first support and the frame; and
   a second vibration isolating unit arranged between the second support and the frame.

4. An apparatus according to claim 1, further comprising a second measuring device configured to measure a positional relationship between the first support and the projection optical system,
   wherein the positional relationship between the first support and the projection optical system is adjusted based on the positional relationship obtained by the second measuring device.

5. An apparatus according to claim 1, wherein the measuring device includes a Z measuring device configured to measure a position of the substrate in a direction parallel to an optical axis of the projection optical system, and an X-Y measuring device configured to measure a position of a mark on the substrate in a direction perpendicular to the optical axis.

6. An apparatus according to claim 1, wherein the measuring device includes at least one of a first measuring device configured to measure a position of a reticle stage configured to hold the reticle and a second measuring device configured to measure a position of a substrate stage configured to hold the substrate.

7. An apparatus according to claim 1, further comprising a measurement station in which a position of a shot on the substrate is measured, and an exposure station in which the substrate is positioned based on the measurement performed in the measurement station and the positioned substrate is exposed to light.

8. A method of manufacturing a device, said method comprising:
   exposing a substrate to light using an exposure apparatus as defined in claim 1;
   developing the exposed substrate; and
   processing the developed substrate to manufacture the device.

* * * * *